United States Patent [19]

Goshima et al.

[11] 4,287,492
[45] Sep. 1, 1981

[54] CONCENTRATED CONSTANT TYPE DELAY DEVICE

[75] Inventors: Yoshio Goshima; Hisashi Osada, both of Tokyo, Japan

[73] Assignee: TDK Electronics Co., Ltd., Tokyo, Japan

[21] Appl. No.: 69,541

[22] Filed: Aug. 24, 1979

[51] Int. Cl.³ .............................................. H03H 7/32
[52] U.S. Cl. ...................................... 333/140; 333/23
[58] Field of Search ............................... 333/138–140, 333/182–185, 167–168, 23; 361/307, 311, 328, 329, 330

[56] References Cited

U.S. PATENT DOCUMENTS

| | | | |
|---|---|---|---|
| 2,847,648 | 8/1958 | Wendolkowski et al. | 333/140 |
| 3,539,949 | 11/1970 | Floser et al. | 333/140 |
| 3,755,762 | 8/1973 | Boulin et al. | 333/185 |
| 3,896,354 | 7/1975 | Coleman et al. | 361/321 |

Primary Examiner—Marvin L. Nussbaum
Attorney, Agent, or Firm—Oblon, Fisher, Spivak, McClelland & Maier

[57] ABSTRACT

A concentrated constant type delay device can be assembled in simple steps and has simple and stable structure. The delay device comprises a composite capacitor which comprises a common electrode placed on one surface of a dielectric and a plurality of separated electrodes placed on the other surface of the dielectric and the separated electrodes being respectively connected to each joint of coils connected between an input terminal and an output terminal.

4 Claims, 8 Drawing Figures

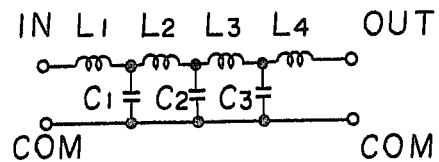
FIG. 1
FIG. 2
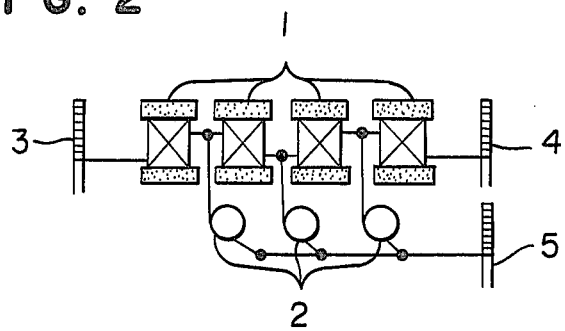
FIG. 3(A)   FIG. 3(B)   FIG. 3(C)
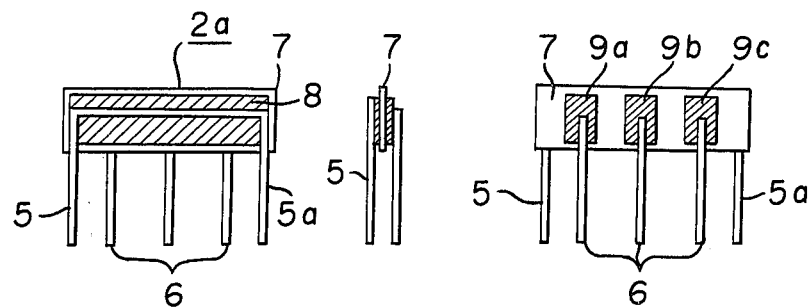
FIG. 4(A)   FIG. 4(B)
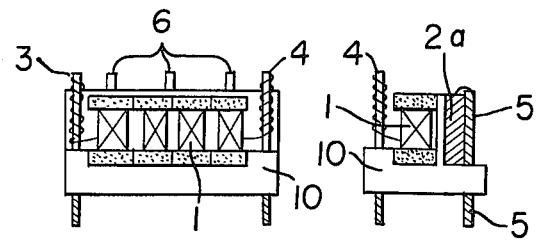
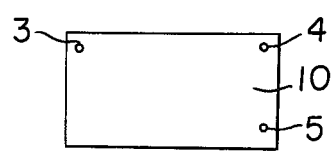
FIG. 4(C)

CONCENTRATED CONSTANT TYPE DELAY DEVICE

BACKGROUND OF THE INVENTION

1. Field of the Invention

The present invention relates to a concentrated constant type delay device which can be assembled in simple steps.

2. Description of the Prior Arts

A concentrated constant type delay device comprises a plurality of coils ($L_1$, $L_2$, $L_3$, $L_4$) which are connected between an input terminal (IN) and an output terminal (OUT); and a plurality of capacitors ($C_1$, $C_2$, $C_3$) which are connected between a common terminal (COM) which is usually earthed and each joint of the coils as shown in FIG. 1.

The circuit shown in FIG. 1 has been used as the delay devices as well as low-pass filters as well-known.

FIG. 2 shows one of the structures of the conventional delay device. An input terminal (3), an output terminal (4) and a common terminal (5) are placed on a substrate (not shown) and a plurality of coils (1) and a plurality of capacitors (2) are connected between the terminals. Accordingly, many wiring steps are disadvantageously required in the assembly to cause high cost of the delay device.

SUMMARY OF THE INVENTION

The present invention is to provide a concentrated constant type delay device which can be assembled in simple steps and which has simple and stable structure and economical. The concentrated constant type delay device comprises a substrate; an input terminal, an output terminal, a common terminal a plurality of coils and a composite capacitor which is used instead of a plurality of capacitors connected in the common terminal and each joint of the coils. The composite capacitor comprises a common electrode placed on one surface of a dielectric and a plurality of electrodes placed on the other surface of the dielectric and the electrodes are respectively connected to each of lead wires. A lead wire connected to the common electrode of the composite capacitor is used as the common terminal.

BRIEF DESCRIPTION OF THE DRAWINGS

FIG. 1 is a circuit diagram of a delay device;

FIG. 2 is a schematic view of the structure of the conventional delay device;

FIGS. 3 (A), (B), (C) are front, side and rear views of a composite capacitor; and FIGS. 4 (A), (B), (C) are front, side and rear plane views of one embodiment of the delay device of the present invention.

DETAILED DESCRIPTION OF THE PREFERRED EMBODIMENTS

Referring to FIGS. 3 (A), (B), (C), the structure of the composite capacitor (2a) used in the delay device of the present invention will be illustrated.

A common electrode (8) is placed on one surface of a dielectric (7) which can be a thin ceramic plate. Common lead wires (5), (5a) are connected to the common electrode (8). A plurality of separated electrodes (9a), (9b), (9c) are placed on the other surface of the dielectric (7). Lead wires (6) are respectively connected to each of these electrodes (6). Thus suitable electrostatic capacities are provided between the common electrode (8) and the separated electrodes (9a), (9b), (9c). The electrostatic capacity of from several to 200 pF can be easily obtained.

The composite capacitor shown in FIGS. 3 (A), (B), (C) is usually molded with a synthetic resin by a casting or melt-dipping method.

One embodiment of the delay device using the composite capacitor of FIG. 3 is shown in FIGS. 4 (A), (B), (C). The input terminal (3), the output terminal (4) and a plurality of coils (1) are placed on the rectangular substrate (10) which is the same as that of the conventional delay device. The composite capacitor (2a) is placed in the longitudinal direction of the substrate (10) so as to upwardly project the lead wires of the separated electrodes. The composite capacitor can be fixed by bonding on the substrate (10). The lead wires (6) projected from the separated electrodes can be used as the terminals for connecting lead wires of the coils (1). The common lead wire (5) of the composite capacitor (2a) is downwardly bent and passed through the substrate (10) to form the common terminal of the delay device. The other common lead wire (5a) is cut off.

In accordance with the structure of the concentrated constant type delay device, the wiring of the capacitors in the common terminal side can be eliminated and the common lead wire of the composite capacitor can be used as the common terminal of the delay device. Therefore the steps for assembling the delay device can be remarkably decreased, the operation time can be shortened, and the processability is improved thereby bringing down the cost for the production of the delay device.

We claim:

1. A concentrated constant type delay device comprising:
   a substrate;
   an input terminal, an output terminal and a common terminal mounted on said substrate;
   a plurality of coils connected in series between said input terminal and said output terminal and having a joint between adjacent coils;
   a plurality of capacitors, equal in number to the number of said joints, each connected between said common terminal and a different one of said joints;
   wherein said plurality of capacitors is formed as a composite capacitor having a dielectric with a common electrode on one surface and a plurality of separated electrodes on the opposite surface, said common electrode having two leads extending therefrom in one direction and said separated electrodes each having one lead extending therefrom in the said one direction and each of said leads of said separated electrodes being connected to a joint;
   wherein one of said leads of said common electrode is passed through said substrate to form said common terminal.

2. A concentrated constant type delay device according to claim 1, wherein said one of said leads of said common electrode is bent in a direction opposite to said one direction before being passed through said substrate and the other of said leads of said common electrode is removed.

3. A concentrated constant type delay device according to claim 2, wherein said leads of said separated electrodes extend upwardly from said substrate and are connected to said joints by means of a lead wire.

4. A concentrated constant type delay device according to claim 1 wherein said composite capacitor is fixed on said substrate by bonding.

* * * * *